United States Patent
Maeda et al.

(10) Patent No.: US 7,748,323 B2
(45) Date of Patent: Jul. 6, 2010

(54) SEMICONDUCTOR BRIDGE DEVICE AND IGNITER INCLUDING SEMICONDUCTOR BRIDGE CIRCUIT DEVICE

(75) Inventors: Shigeru Maeda, Takasaki (JP); Hirotaka Mukunoki, Saitama (JP)

(73) Assignee: Nipponkayaku Kabushikikaisha (JP)

( * ) Notice: Subject to any disclaimer, the term of this patent is extended or adjusted under 35 U.S.C. 154(b) by 439 days.

(21) Appl. No.: 11/664,462

(22) PCT Filed: Oct. 4, 2005

(86) PCT No.: PCT/JP2005/018718
§ 371 (c)(1), (2), (4) Date: Apr. 27, 2007

(87) PCT Pub. No.: WO2006/038703
PCT Pub. Date: Apr. 13, 2006

(65) Prior Publication Data
US 2008/0083343 A1    Apr. 10, 2008

(30) Foreign Application Priority Data
Oct. 4, 2004    (JP) ............................. 2004-290993

(51) Int. Cl.
F42B 3/10    (2006.01)
(52) U.S. Cl. .............. 102/202.7; 102/202.1; 102/202.2; 102/202.5; 102/202.8; 102/202.11; 361/247; 361/248; 361/251
(58) Field of Classification Search .............. 102/202.1, 102/202.2, 202.5, 202.7, 202.8, 202.11–202.14, 102/205; 361/247, 248, 251; 149/14, 15; 257/536–567
See application file for complete search history.

(56) References Cited

U.S. PATENT DOCUMENTS

| 4,729,315 A | * | 3/1988 | Proffit et al. .............. 102/202.9 |
| 5,309,841 A | * | 5/1994 | Hartman et al. .......... 102/202.4 |
| 5,992,326 A | * | 11/1999 | Martinez-Tovar et al. 102/202.4 |

(Continued)

FOREIGN PATENT DOCUMENTS

EP    0 143 071    5/1985

(Continued)

OTHER PUBLICATIONS

Chinese Office Action (5 pages).

*Primary Examiner*—James S Bergin
*Assistant Examiner*—Michael D David
(74) *Attorney, Agent, or Firm*—Dickstein Shapiro LLP (57) ABSTRACT

There is provided a semiconductor bridge device wherein a reaction time for generating sparks is short and a spark generating amount is large. This semiconductor bridge device comprises a substrate, a pair of land portions, a bridge portion electrically connecting between the pair of the land portions, and an electrode pad arranged on each upper surface in the pair of the land portions and emitting sparks at the bridge portion through an electric current passed between the electrode pads, in which the pair of the land portions and the bridge portion consist of a laminate formed by alternately laminating a metal layer and a metal oxide layer plural times, and an outermost layer in the laminate is a metal layer, and a metal oxide having a decomposition temperature of higher than 1500° C. is used in the metal oxide layer.

10 Claims, 4 Drawing Sheets

U.S. PATENT DOCUMENTS

| | | | |
|---|---|---|---|
| 6,054,760 A | 4/2000 | Martinez-Tovar et al. | |
| 6,199,484 B1 * | 3/2001 | Martinez-Tovar et al. | 102/202.4 |
| 6,272,965 B1 * | 8/2001 | Baginski et al. | 86/1.1 |
| 6,470,802 B1 | 10/2002 | Neyer et al. | |
| 6,591,752 B2 * | 7/2003 | Blomquist | 102/202.5 |
| 6,749,702 B1 * | 6/2004 | Knowlton et al. | 149/38 |
| 6,772,692 B2 * | 8/2004 | Baginski et al. | 102/202.7 |
| 6,895,863 B2 * | 5/2005 | Hatzl et al. | 102/202.5 |
| 2002/0108686 A1 * | 8/2002 | Blomquist | 149/19.8 |
| 2003/0164106 A1 | 9/2003 | Mueller-Fiedler et al. | |
| 2003/0192445 A1 | 10/2003 | Baginski et al. | |
| 2008/0035252 A1 * | 2/2008 | Mallery et al. | 149/22 |

FOREIGN PATENT DOCUMENTS

| | | |
|---|---|---|
| GB | 2 224 729 A | 5/1990 |
| JP | 07-061319 | 3/1995 |
| WO | WO 02/21067 A3 | 3/2002 |

* cited by examiner

| | Ti/B (Patent Document 1) | Ti/SiO₂ (Invention Example) |
|---|---|---|
| Resistance value of bridge circuit portion | | |
| 2Ω (440 μJ) |  |  |
| 5Ω (314 μJ) | | |

SEMICONDUCTOR BRIDGE DEVICE AND IGNITER INCLUDING SEMICONDUCTOR BRIDGE CIRCUIT DEVICE

TECHNICAL FIELD

This invention relates to a semiconductor bridge device, and more particularly to a semiconductor bridge device having a bridge portion constituted with a laminate formed by alternately laminating a metal layer and a metal oxide layer having particular properties plural times as well as an igniter including such a semiconductor bridge device.

RELATED ART

In general, an igniter starts an exothermic reaction such as mechanical shock wave and/or combustion, deflagration or explosion upon receiving an electric energy.

Therefore, the igniter is applied to various business uses and government uses. Examples include an expansion starting means in an air bag of an automobile, an activation means for an energy source in a weapon system, and the like.

In the conventional igniter, a bridging wire is used as a means for igniting a primary charge. The bridging wire is a fine resisting wire extending between two contact points. The primary charge is disposed so as to surround the bridging wire.

In the igniter having such a structure, as an electric current passes through the bridging wire, resistance heating ignites the primary charge when the heating temperature of the bridging wire reaches an ignition temperature of the primary charge. In general, an ignition charge having a stronger inflammation force is disposed outside the primary charge, and a main power charge is ignited by such an ignition charge. Recently, it has been suggested to control an operation of the igniter by a communication signal from a wire LAN built in the automobile.

However, the igniter using such a bridging wire has a serious drawback in the existing use application.

For example, it is easily subjected to an increased electromagnetic interference (EMI) that may be present in many military and consumer use applications. A higher level EMI presents a serious risk, because there is a possibility that EMI feeds an electromagnetic energy to the igniter through a direct pathway or indirect pathway and may ignite the igniter even in an unintended case. That is, there is a fear that the igniter unintentionally ignites through an electrostatic discharge (ESD).

In the conventional igniter, therefore, a passive filter circuit or an EMI shielding means is arranged for obtaining protection from unintentional discharge in the standard use application, but the arrangement of such a protection means becomes remarkably detrimental in view of the space and weight. Also, when the ignition of the igniter is controlled by the recently examined LAN, in order to conduct the ignition by an energy of a communication signal component through the bridging wire, a size of a condenser storing the energy becomes big, and hence the arrangement of communication and switch circuits in the igniter becomes remarkably detrimental in view of the space and weight.

One device addressing the problem of accidental ignition is known as a semiconductor bridge device, i.e. SCB (semiconductor bridge). This semiconductor bridge device can conduct the ignition at an energy smaller than an ignition energy required in the igniter using the bridging wire of the same non-ignition level. That is, the ignition energy required in the semiconductor bridge device is smaller by one digit than the ignition energy required in the igniter using the bridging wire with the same non-ignition performance.

The semiconductor bridge device generally ignites the primary charge through high-temperature sparks. That is, as the semiconductor bridge device ignites, high-temperature sparks having an output density high enough to ignite the primary charge (e.g. higher than 4000 degree Kelvin in some cases) are emitted. Also, the semiconductor bridge device emits sparks in a short time of a few microseconds, as compared with the bridging wire that is heated to an ignition point for about several hundreds microseconds. The primary charge to be ignited by the semiconductor bridge device is a propellant adjacent to the semiconductor bridge device, i.e. an initial explosion substance, which is usually ignited in only a few microseconds to further ignite an ignition charge as an output power charge.

Moreover, the semiconductor bridge device is generally driven by a low impedance power source or a capacitive discharge (discharge from a condenser) capable of supplying an electric current suitable for the formation of sparks.

An example of the semiconductor bridge device and the igniter including such a semiconductor bridge device is disclosed in Patent Document 1, Patent Document 2 and Patent Document 3, respectively.

The semiconductor bridge device disclosed in the Patent Document 1 comprises a laminate made from a series of layers each having a reactive metal such as titanium or a reactive insulator such as boron.

Also, the semiconductor bridge device disclosed in the Patent Document 2 comprises a laminate made from an oxidizer layer producing oxygen through heating and a metal layer.

Further, the semiconductor bridge device disclosed in the Patent Document 3 comprises a laminate made from an oxide layer such as copper oxide layer, silicon oxide layer or the like and a metal layer such as palladium, nickel-chromium or the like.

Patent Document 1: JP-A-2004-513319
Patent Document 2: JP-A-H07-61319
Patent Document 3: JP-A-2004-518939

The semiconductor bridge device of the Patent Document 1 has no problem in the reaction time, but has a problem that the output density or spark emitting amount at the bridge portion is insufficient.

Inversely, the semiconductor bridge device of the Patent Document 2 has no problem in the spark emitting amount, but has a problem that the reaction for the emission of sparks takes a long time because oxygen is generated by the chemical reaction and thereafter ignited.

Further, the semiconductor bridge device of the Patent Document 3 has a structure including a resistance layer as a main body for heat generation located in a lowest part and disposed in contact with a silicon substrate, so that there is a problem that the ignition efficiency is poor because the generated heat is absorbed by the silicon substrate. Also, this semiconductor bridge device has a structure including an insulating layer, reaction layer or the like formed in only the bridge portion and an electrode pad formed in a portion other than the bridge portion, so that it is disadvantageous to take complicated production steps.

SUMMARY OF THE INVENTION

The invention advantageously solves the above problems and provides a semiconductor bridge device capable of igniting in a short operating time of a few microseconds while requiring low energy for the operation and having a sufficiently large spark emitting amount. An igniter including such a semiconductor bridge device is also disclosed.

The inventors have made various studies in order to achieve the above objectives and found that an amount of sparks sufficient to ignite the primary charge can be emitted by combining a certain type of a metal with a certain type of an oxide without requiring an oxygen addition step of generating oxygen through heating, and a greater amount of sparks can be emitted in a short time without the chemical reaction.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DESCRIPTION OF REFERENCE SYMBOLS

1 Semiconductor bridge device
10 Substrate
12 Layer of silicon dioxide
14-1, 14-2 Opening portion
16-1, 16-2 Doping region
20 Laminate
22-1, 22-2, 22-3 Metal layer
24-1, 24-2, 24-3 Metal oxide layer
25 Adhesion layer 30, 32 Land portion
34 Electrode pad
36 Bridge portion 100 Igniter
110 Plug (header)
120 Electric connecting member
130 Conductive pin 140 Cup body (cap) 150 Primary charge 200 Condenser
210 Switch
220 Semiconductor bridge device
230 Equivalent circuit resistance

BEST MODE FOR CARRYING OUT THE INVENTION

The invention will be described more detail with reference to the accompanying drawings below.

Figure 1:
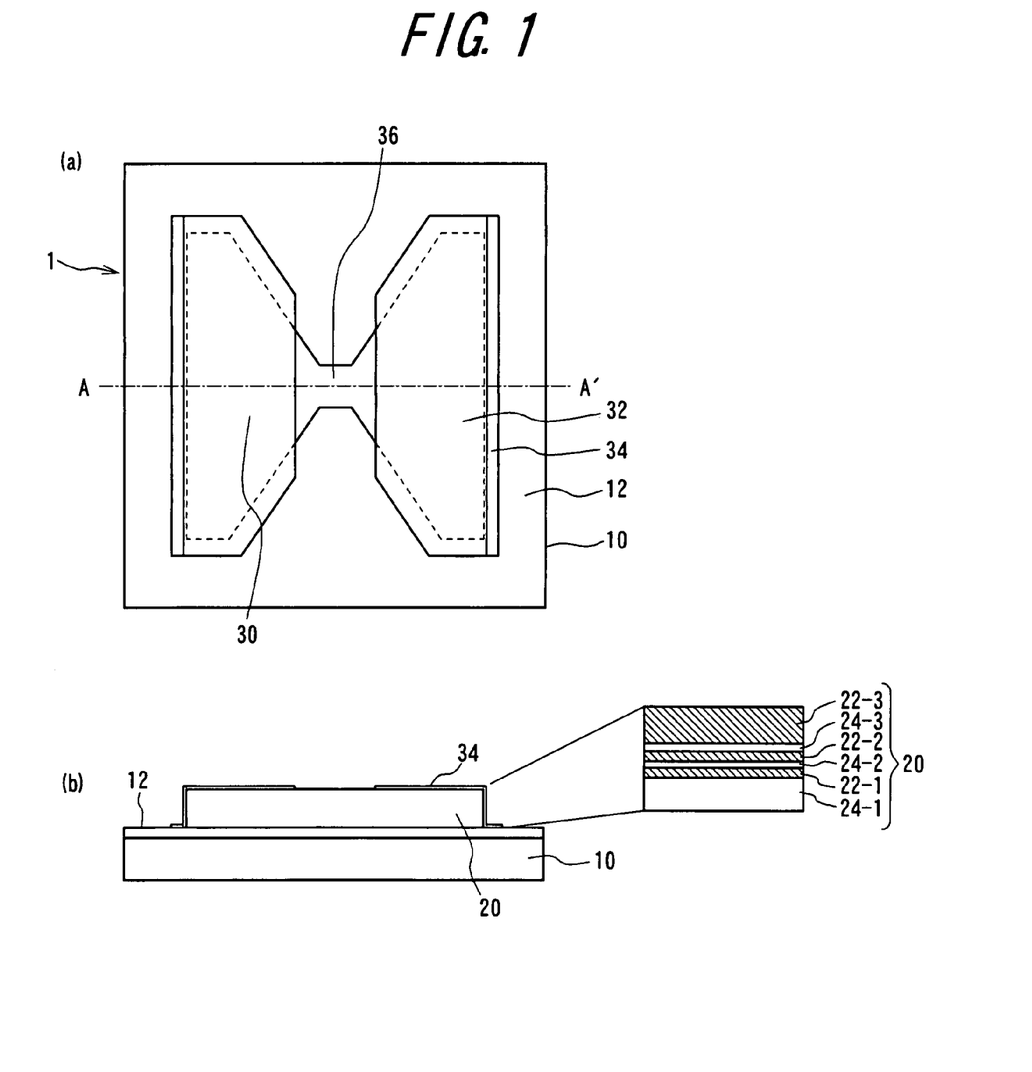
FIG. 1 is a plan view (a) and a section view (b) of a semiconductor bridge device according to the invention.

In FIGS. 1(a) and (b) a plan and a section (A-A' section) of a typical semiconductor bridge device according to the invention are shown.

Numeral 1 shows a whole of the semiconductor bridge device. Numeral 10 is a substrate, which may be silicon, and numeral 12 is a layer of silicon dioxide formed on the substrate 10, wherein the silicon dioxide layer 12 functions as an electrically insulating material for the substrate 10. Moreover, the silicon dioxide layer 12 is not necessarily required and may be omitted.

In the invention, a laminate 20 is formed by alternately laminating metal oxide layers 24-1 to 24-3 and metal layers 22-1 to 22-3 on the substrate 10 provided with the electrically insulating layer 12 of silicon dioxide. Even if the substrate 10 is a silicon substrate provided, for example, with the silicon dioxide layer, it is preferable that the lowest layer of the laminate is the metal oxide layer such as $SiO_2$ layer. Because $SiO_2$ as the lowest layer 24-1 has a function of blocking off heat generated by the metal layer as an upper layer to suppress heat release to the substrate, it becomes advantageous to restrict the transmission of heat to the thickness direction in the heat insulation since it is formed at the same width as a bridge portion. Moreover, if the adhesion property between the metal oxide layer and the substrate is not sufficient, an adhesion layer 25 may be disposed therebetween. The adhesion layer may include Ti or Cr.

According to the invention, the laminate is formed by alternately laminating the metal layer and the metal oxide layer plural times as mentioned above. In this case, it is necessary that the lamination number is two or more of a set of the metal layer and the metal oxide layer and an outermost surface is the metal layer.

Laminating-plural sets of the metal layer and the metal oxide layer can emit a greater amount of sparks than only laminating one metal layer and one metal oxide layer.

Although the reason is not yet elucidated clearly, when the structure of laminating plural sets of the metal layer and the metal oxide layer is compared with the one set structure, the total thickness of the metal layer becomes thicker in the plural set structure than in the one set structure for realizing the same resistance. This is considered due to two influences: because the land portion is covered with the electrode pad, the application of an electric current to a middle layer is conducted from a side face of the laminate and hence a contact resistance is included; and as the metal is made thin, a volume resistivity higher than the usual bulk value is indicated.

As the metal layer becomes thick, a greater amount of sparks can be emitted for two reasons discussed below.

(1) At the initial current application, it is considered that the electric current is mainly passed to the outermost layer having a thickest thickness to heat this layer, whereby the outermost layer is first vaporized while involving the metal oxide layer such as $SiO_2$ or the like located below the outermost layer. As the outermost layer disappears, the remaining current concentrates into the lower layer. As a result, such a layer is vaporized and flied while involving $SiO_2$ located therebelow. That is, the emission of sparks is successively caused from the outermost layer among the plural layers to make a time of emitting sparks long.

(2) Particularly, when the metal layer is made of Ti or Zr, the metal layer is over-heated by the application of the electric current to vaporize over a boiling point in a few microseconds at once. However, the high-temperature Ti or Zr can react with oxygen in air during the flying, so that big sparks can be emitted as the total amount of Ti becomes large.

Further, the reason why the outermost layer is the metal layer, preferably the metal layer having a thickest thickness, is due to the fact that the electric current concentrates into the thick outermost layer as compared with the thin middle layer and also the heat generation concentrates thereinto, but the temperature can be raised at a further lower energy to improve the ignition efficiency because the outermost layer located farthest from the substrate and the plural metal oxide layers are located between the outermost layer and the substrate to provide a thermal blocking effect from the substrate.

In the invention, a material of the metal oxide layer is particularly important among the above metal oxide layers and the metal layers. As the metal oxide layer, it is necessary to use an oxide having a decomposition temperature of higher than 1500° C. When the decomposition temperature exceeds 1500° C., the metal oxide layer does not generate oxygen up to a temperature of fusing the metal layer, so that the metal layer is not physically destroyed at a solid state by the occurrence of gas from the lower layer and the application of the electric current is kept.

Materials suitable for the metal oxide layer in the invention, or as the metal oxide layer having the decomposition temperature of higher than 1500° C., include, for example, $SiO_2$, $TiO_2$, $Al_2O_3$ and the like.

Materials suitable for the metal layer in the invention include Au, Al, Ag, Bi, C, Co, Cr, Cu, Fe, Ge, Hf, In, Ir, Mg, Mo, Nb, Ni, Pb, Pt, n-type Si, p-type Si, Sn, Ta, Ti, V, W, Zn, Zr and so on.

Among the above metal oxide layers and the metal layers, a preferable combination is a combination of $SiO_2$ or $TiO_2$ as a metal oxide and Ti or Zr as a metal. This combination obtains a particularly greater spark emitting amount. A combination of $SiO_2$ and Ti is optimum because the greatest spark emitting amount is obtained.

It is preferable that the thickness of each of the middle metal layers and metal oxide layers in the laminate is 0.02-3 microns.

When the thickness of each of the middle metal layer and metal oxide layer is less than 0.02 micron, if the set number is same, the total Ti amount is near to that of the one set structure and the sufficient spark emitting amount is not obtained. If it is intended to include a greater amount of Ti into the semiconductor bridge, several layers should be laminated, which considerably decreases the productivity.

On the other hand, when the thickness exceeds 3 microns, each of the layers becomes too thick, the concentration of the current into the metal layer is difficult in the initial current application, and the ignition at a low energy is difficult.

Preferably, the thickness of each of the middle metal layer and metal oxide layer is within a range of 0.2-0.25 micron.

Also, the thickness of the whole laminate is preferably 0.1-10 microns. When such a thickness is less than 0.1 micron, the volume of the bridge portion as a spark source is too small and the flying spark becomes small, while when it exceeds 10 microns, the volume of the bridge portion is large and an excessive energy is required for sparking the whole of the bridge portion. Further, if a thin film is formed by vacuum deposition or sputtering, stress is generated in the inside of the film. As the thickness of the film becomes thicker, the stress becomes large and there is a fear of peeling the bridge portion from the substrate.

The preferable thickness of the whole laminate is within a range of 0.6-4 microns.

In the invention, the outermost layer of the laminate is the metal layer, in which the thickness of the outermost metal layer is preferably 0.5-3 microns. When such a thickness is less than 0.5 micron, the thickness difference to the middle layer becomes not sufficient, and hence a sufficient quantity of current can not be concentratedly flowed in the initial current application and the amount of sparks lowers, while when it exceeds 3 microns, a greater amount of energy is required for vaporizing the thick metal layers and ignition at a low energy becomes difficult. The more preferable thickness is within a range of 1-2 microns.

As shown in FIG. 1(b), when the lowest layer in the laminate is the metal oxide layer, the thickness is preferable to be 0.5-3 microns. When such a thickness is less than 0.5 micron, heat generated in the metal layer is transferred to the substrate to cause energy loss and hence the ignition at a low energy becomes difficult, while when it exceeds 3 microns, the blocking of heat to the substrate is improved but stress generated in the inside of the film becomes larger and the risk of peeling increases. The more preferable thickness is within a range of 1-3 microns, in view of the ease of production.

Moreover, when the lowest layer is the metal layer, heat generated in the laminate is not scattered to the substrate and hence the emission of sparks is promoted.

Further, when the plural metal layers and metal oxide layers are laminated, it is advantageous that the thickness of the metal layer becomes thicker toward the surface of the laminate, while the thickness of the metal oxide layer becomes thicker toward the substrate.

That is, it is important that current is concentrated into the outermost layer hardly causing the heat dissipation to the substrate in the initial current application for the ignition at a low energy. After the sparking of the outermost layer, the metal layer located underneath becomes a thicker layer, and current concentrates in this layer. Thus, the sparking sequentially proceeds downward from the upper layer, but in this case, the charge quantity inside the condenser used as a power source is decreased as compared with the initial one in the sparking of the lower layer, so the sparking can be conducted efficiently by the remaining charge quantity as the thickness of the metal layer becomes thinner toward the lower side.

On the contrary, it is necessary that the thickness of the metal oxide layer becomes thicker toward the substrate for sufficiently ensuring the thermal insulation to the metal layer located therebeneath in order to proceed the sparking toward the lower layer and at the same time vaporize the thin metal layer at a less energy left in the condenser.

Moreover, the number of sets to be laminated is preferably 2-5 sets, more preferably 3-4 sets.

Incidentally, the preferable thickness of each layer when using Ti as the metal layer and $SiO_2$ as the metal oxide layer is as follows. That is, viewing from the surface of the substrate:

thickness of $SiO_2$ layer 24-1: 1.0 μm
thickness of Ti layer 22-1: 0.25 μm
thickness of $SiO_2$ layer 24-2: 0.225 μm
thickness of Ti layer 22-2: 0.25 μm
thickness of $SiO_2$ layer 24-3: 0.225 μm and
thickness of Ti layer 22-3: 1.0 μm.

In this case, the thickness of the laminate is 2.95 pm as a totalization of thicknesses of $SiO_2$ layers 24-1 to 24-3 and Ti layers 22-1 to 22-3.

The laminate 20 is formed as land portions 30, 32 and bridge portion 36 by so-called lift-off procedures. That is, a resist is previously formed on a substrate so as to expose portions of the substrate corresponding to the land portions 30, 32 and the bridge portion 36 located between the two land portions and then Ti and $SiO_2$ films for the laminate are formed thereon and thereafter the resist is removed to form the land portions 30, 32 and bridge portion 36 on the substrate.

The two land portions 30, 32 have a relatively large area on the substrate 10. The bridge portion has a relatively narrow area in a plane parallel to the surface of the substrate 10, or in a direction perpendicular to a deposition direction of the layers for the laminate.

It is preferable that the area of the bridge portion 36 is adjusted so that the resistance value of the bridge portion is 0.5-10Ω. More preferably, the resistance value is 2-7Ω. When the resistance value is within the above range, there can be provided the emission of stable sparks.

As an example, when a narrowest part of the bridge portion 36 in the plane parallel to the surface of the substrate 10 is 50 μm in width and 50 μm in length, the resistance value of the bridge portion 36 is approximately 2Ω. Also, when the narrowest part of the bridge portion 36 is 20 μm in width and 120 μm in length, the resistance value of the bridge portion 36 is approximately 5Ω.

Also, a protection film may be disposed on the upper surface of the bridge portion. SiO2, SiN and the like are advantageously adaptable as a material of the protection film. By forming the protection film the chemical influence of chemical components included in the primary charge upon the bridge portion can be removed.

After the formation of the two land portions 30, 32 and bridge portion 36, electrode pads 34 are formed on the two land portions 30, 32 by depositing a suitable electrically conductive material through the lift-off procedures or the like. Moreover, Al or the like is advantageously adaptable as a material for the electrode pad 34.

When current flows through the electrode pads 34 to the bridge portion 36, resisting heat is generated in not only the outermost metal layer. e.g. Ti layer 22-3 but also the middle Ti layers 22-1, 22-2. By this heat generation, the Ti layers 22-1 to 22-3 are fused and vaporized to emit sparks. The metal oxide layers, e.g. SiO2 layers 24-1 to 24-3 can preferably maintain the bridge form up to the emission of sparks because they are high in the heat insulating properties and do not generate oxygen, and hence sparks of large capacity can be emitted.

This is considered as follows.

In the semiconductor bridge device according to the invention, the mechanism of spark emission lies in that sparks are emitted by a so-called physical phenomenon, wherein the metal layer is heated by the current application and vaporized over a boiling point thereof in several microseconds.

At the initial current application, the current is concentrated into the metal layer as an outermost layer having a maximum thickness such as Ti layer to heat the Ti layer. Under this heat, the metal oxide layer such as SiO2 layer just beneath the metal layer is exposed to a high temperature. However, since the metal oxide layer does not decompose below 1500° C., the boost-up of the Ti layer that results from a gas generated by the decomposition of SiO2 during the holding of solid Ti is not caused, so that the current application to Ti is maintained to further raise the temperature. Since $SiO_2$ is very high in the heat insulating property, heat generated in the Ti layer is mainly stored in the interior of the Ti layer and finally comes to a melting point. At this moment, the resistance value becomes very high compared to that at room temperature due to the resistance temperature coefficient inherent to the metal, and the heat generation by the current application, more concentrated by the increase of the resistance, immediately exceeds the boiling point, whereby Ti is vaporized at a time of exceeding the melting point. This procedure takes only several microseconds. Under such a short time phenomenon, the system supposing the mass transfer such as chemical reaction or the like can not be acted sufficiently, but rather the sparks emitted by the physical phenomenon can surely promote the ignition. As the Ti layer reaches the melting point at once, even if the gas is generated from the SiO2 layer located therebeneath, the current application is maintained without causing the cracking of the Ti layer. Moreover, if the Ti layer is solid and the gas is generated from underneath, there is a fear of causing the cracking due to the pressure of the generated gas or an oxidation reaction at an insufficient temperature.

Since the semiconductor bridge device according to the invention utilizes minute explosions of the bridge portion through the vaporization of the metal at a temperature changing from solid to liquid and further exceeding the boiling point, the sparks come to a very high temperature. Further, SiO2 blocks the transfer of heat generated in Ti to the substrate and is simultaneously robbed together with Ti at the time of the explosion through vaporization. At this moment, SiO2 itself becomes higher temperature because it is adjacent to Ti and flies as hot particles. Moreover, Ti can react with oxygen in air on the way of flying at the high temperature to further enlarge the sparks.

Figure 2:
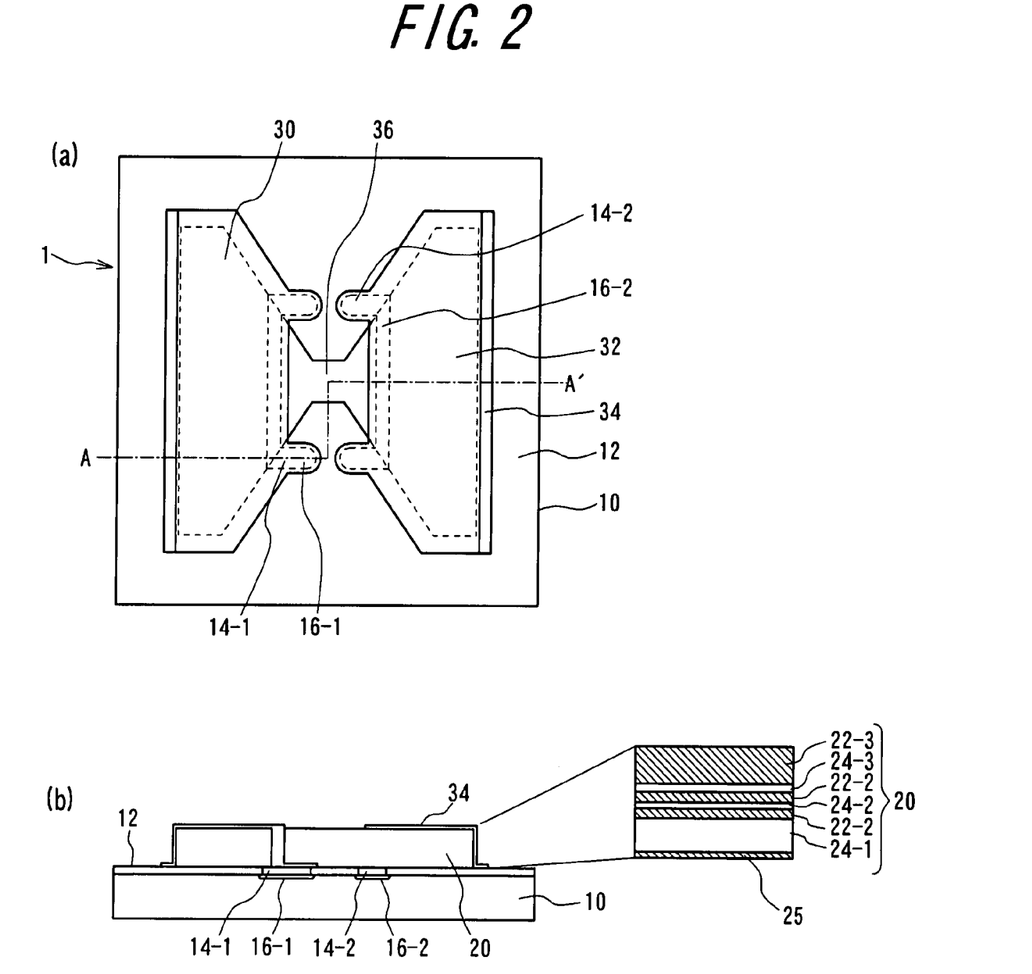
FIG. 2 is a plan view (a) and a section view (b) of a semiconductor bridge device according to the invention comprising a substrate with a diode.

Although the above is described with respect to the typical structure of the semiconductor bridge device according to the invention, as the other structure of the invention, a diode can be formed on the substrate as shown in FIG. 2 for the purpose of preventing wrong ignition due to static discharge.

That is, as shown in FIG. 2, a silicon dioxide layer 12 is selectively etched by using a proper etching technique to form opening portions 14-1, 14-2, whereby a surface of, for example, n-type substrate 10 is exposed. Then, the portions of the substrate exposing the opening portions 14-1, 14-2 are doped with an impurity so as to form a p-type semiconductor, whereby a p-n junction is constituted. Next, a metal such as aluminum or the like is deposited thereon so as to clog the opening portions. By such a structure, a zener diode integrated in the semiconductor bridge device can be incorporated into the opening portions 14-1, 14-2. The zener diode of p-n junction formed on the opening portions 141, 14-2 is electrically connected to the n-region of the substrate in series and forms a parallel connection to the bridge portion through the pads.

Moreover, the breakdown voltage of the zener diode to be formed can be changed by doping a proper substance in the doping regions 16-1, 16-2 corresponding to the opening portions 14-1, 14-2 of the substrate 10. For example, the breakdown voltage of 7-8 volts provides protection from static discharge (ESD) in applications such as a starter of an air bag for an automobile or the like. In applications requiring a bridge portion having a lower sensitivity, a higher breakdown voltage is used.

Although the above is explained with respect to the semiconductor bridge device according to the invention, the following is explained with respect to an igniter provided with such a semiconductor bridge device.

Figure 3:
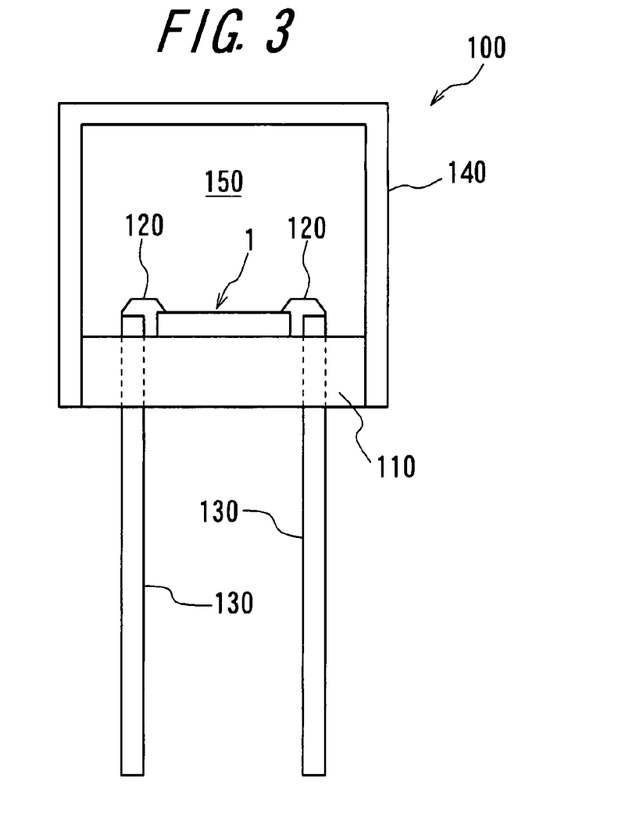
FIG. 3 is a section view of an igniter.

FIG. 3 is a section view of an igniter according to the invention.

In this figure, numeral 100 is a whole of the igniter, numeral 140 a cup body (which may be called as a cap), and numeral 150 a primary charge. The primary charge preferably contains zirconium therein. Further, it may advantageously contain titanium hydride or boron, a triisocyanate or the like.

Numeral 110 is a plug made from an alloy (which may be called a header). In the plug 110 are kept electrode pins 130 for electrically connecting to exterior through glass sealing so as to insulate them with each other. By such a glass sealing the electrode pins 130 can be fixed and the electric insulation can be ensured while maintaining a high airtightness.

Also, the electrode pins 130 are connected to the semiconductor bridge device 1 as a heating element through electric connecting members 120 in the inside of the cup body 140 and transfer signals from the exterior to the semiconductor bridge device 1.

Moreover, an electric circuit such as ASIC or the like (not shown) can be built in the interior of the igniter, if necessary. At this moment, ASIC (Application Specific Integrated Circuit) means an integrated circuit for special applications and has a function as an intercommunication switch means for igniting a squib based on a coded information intercommunicated to the exterior.

In the operation of the igniter having the above construction, an ignition signal supplied from the exterior passes through the electrode pins 130 and is supplied from the electric connecting members 120 through the electrode pads 34 of the semiconductor bridge device 1 to the bridge portion 36 to emit sparks at the bridge portion 36. The sparks emitted in the bridge portion 36 ignite the primary charge 150 placed on the bridge portion 36 inside the cup body 140.

EXAMPLES

In this example is examined the state of actually emitting sparks by mounting the semiconductor bridge device according to the invention shown in FIG. 1 onto the igniter shown in FIG. 3.

Figure 4:
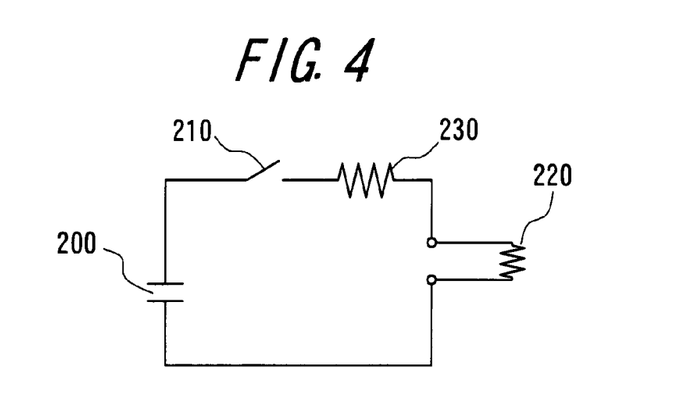
FIG. 4 is a circuit diagram used in an ignition experiment.

Moreover, this experiment is carried out by transferring an ignition signal to the igniter at a state of exposing the semiconductor bridge device without mounting the cup body and the primary charge in the igniter, during which the reaction time (time emitting sparks) and the spark emitting height are measured. A circuit used in the ignition is shown in FIG. 4. A current is applied to a semiconductor bridge device 220 by charging a condenser 200 and switching on a switch 210. In this figure, numeral 230 is an equivalent circuit resistance.

Materials used as a metal layer and a metal oxide layer are shown in Table 1.

Also, the thickness of each layer is as follows:
Thickness of first metal oxide layer: 1 μm
Thickness of first metal layer: 0.25 μm
Thickness of second metal oxide layer 24-2: 0.225 μm
Thickness of second metal layer 22-2: 0.25 μm
Thickness of third metal oxide layer 24-3: 0.225 μm
Thickness of third metal layer 22-3: 1 μm
Thickness of whole laminate: 2.95 μm.

In any case, the resistance value of the bridge portion is made to 2Ω or 5Ω by adjusting the width and the length of the bridge portion.

For the comparison, the same experiment is carried out by preparing a semiconductor bridge device having a set structure consisting of one metal layer and one metal oxide layer, or a semiconductor bridge device disclosed in Patent Document 1.

The preparing conditions of the semiconductor bridge devices of the comparative example and Patent Document 1 are as follows:

(1) Comparative Example

Innermost layer: SiO2 layer (thickness: 1.65 μm)
Outermost layer: Ti layer (thickness: 1.3 μm)
Thickness of whole laminate: 2.95 μm (2) Patent Document 1

By using titanium (Ti) as a reactive metal and boron (B) as a reactive insulating material are formed the following as viewed from the substrate:
Boron: 1 μm, Titanium: 0.25 μm
Boron: 0.225 μm, Titanium: 0.25 μm
Boron: 0.225 μm, Titanium: 1 μm
Thickness of whole laminate: 2.95 μm Moreover, the numerical values disclosed in the example of Patent Document 2 are shown in Table 1 for the comparison.

TABLE 1

| No. | Structure of bridge portion | Target resistance (Ω) | Input energy (μJ) | Reaction time (μsecond) | Spark height (mm) | Remarks |
|---|---|---|---|---|---|---|
| 1 | Metal layer: Ti, Metal oxide layer: $SiO_2$ innermost layer $SiO_2$ = 1 μm/Ti = 0.25 μm/$SiO_2$ = 0.225 μm/Ti = 0.25 μm/$SiO_2$ = 0.225 μm/outermost layer Ti = 1 μm | 2 | 440 | 1.0 | 20 | Invention Example 1 |
| 2 | Metal layer: Ti, Metal oxide layer: $SiO_2$ innermost layer $SiO_2$ = 1 μm/Ti = 0.25 μm/$SiO_2$ = 0.225 μm/Ti = 0.25 μm/$SiO_2$ = 0.225 μm/outermost layer Ti = 1 μm | 5 | 314 | 1.5 | 18 | Invention Example 2 |
| 3 | Metal layer: Ti, Metal oxide layer: $SiO_2$ innermost layer $SiO_2$ = 1 μm/Ti = 0.25 μm/$SiO_2$ = 0.225 μm/Ti = 0.25 μm/$SiO_2$ = 0.225 μm/outermost layer Ti = 1 μm | 5 | 186 | 11 | 7.2 | Invention Example 3 |
| 4 | Metal layer: Ti, Metal oxide layer: $SiO_2$ innermost layer $SiO_2$ = 1.65 μm/outermost layer Ti = 1.3 μm | 5 | 440 | 1.1 | 11 | Comparative Example 1 |
| 5 | Metal layer: Ti, Metal oxide layer: $SiO_2$ innermost layer $SiO_2$ = 1.65 μm/outermost layer Ti = 1.3 μm | 5 | 186 | 2.5 | 2.5 | Comparative Example 2 |
| 6 | Reactive metal: Ti, Reactive insulating material: boron (B) innermost layer B = 1 μm/Ti = 0.25 μm/B = 0.225 μm/Ti = 0.25 μm/B = 0.225 μm/outermost layer Ti = 1 μm | 2 | 440 | 7.1 | 17 | Conventional Example 1 (Patent Document 1) |
| 7 | Reactive metal: Ti, Reactive insulating material: boron (B) innermost layer B = 1 μm/Ti = 0.25 μm/B = 0.225 μm/Ti = 0.25 μm/B = 0.225 μm/outermost layer Ti = 1 μm | 5 | 314 | 3.7 | 3 | Conventional Example 2 (Patent Document 1) |

TABLE 1-continued

| No. | Structure of bridge portion | Target resistance (Ω) | Input energy (μJ) | Reaction time (μsecond) | Spark height (mm) | Remarks |
|---|---|---|---|---|---|---|
| 8 | Reactive metal: Ti, Reactive insulating material: boron (B) innermost layer B = 1 μm/Ti = 0.25 μm/B = 0.225 μm/Ti = 0.25 μm/B = 0.225 μm/outermost layer Ti = 1 μm | 5 | 186 | 8.6 | 1.5 | Conventional Example 3 (Patent Document 1) |
| 9 | Non-oxidation layer: Ti, Oxidizing agent layer: copper oxide (CuO) From the bottom, silicon oxide: 0.5 μm Ni: 0.5 μm CuO: 1 μm Ti: 0.5 μm CuO: 1 μm | 2 | 2300 | 550 | 8 | Conventional Example 4 (Patent Document 2) |

As seen from the above table, the semiconductor bridge device according to the invention can emit large sparks of 20 mm in a short reaction time of 1 microsecond, for example, when the resistance value of the bridge portion is 2Ω. Also, when the resistance value of the bridge portion is 5Ω, large sparks of 7.2-18 mm can be emitted in a short reaction time of 1.5-3.1 microsecond. Particularly, when Ti is used as the metal layer and SiO2 is used as the metal oxide layer, the excellent results are obtained.

By contrast, Comparative Example 1 having the one set structure of metal layer and metal oxide layer does not provide the same spark emitting height as in Invention Example 1. Also, Comparative Example 2 does not provide the same spark emitting height as in Invention Example 3 as seen from the comparison with Invention Example 3 having the same resistance value of bridge portion and input energy.

In case of using the semiconductor bridge device disclosed in Patent Document 1 (Nos. 6, 7, 8), as seen from the comparison with the invention examples of Nos. 1, 2 and 3, the good spark emitting height can not be obtained as compared with the invention. Also, when the input energy is made low in the semiconductor bridge device disclosed in Patent Document 1, there is a disadvantage that the spark emitting height lowers extremely.

In the semiconductor bridge device disclosed in Patent Document 2, the spark emitting height is low but also the reaction time is 550 microseconds and is longer than that of the invention (No. 1).

In the invention, even when the resistance value of the bridge portion is as high as 5Ω and the input energy is small as 186 pJ, the spark height enough to ignite the primary charge can be obtained.

Figure 5:
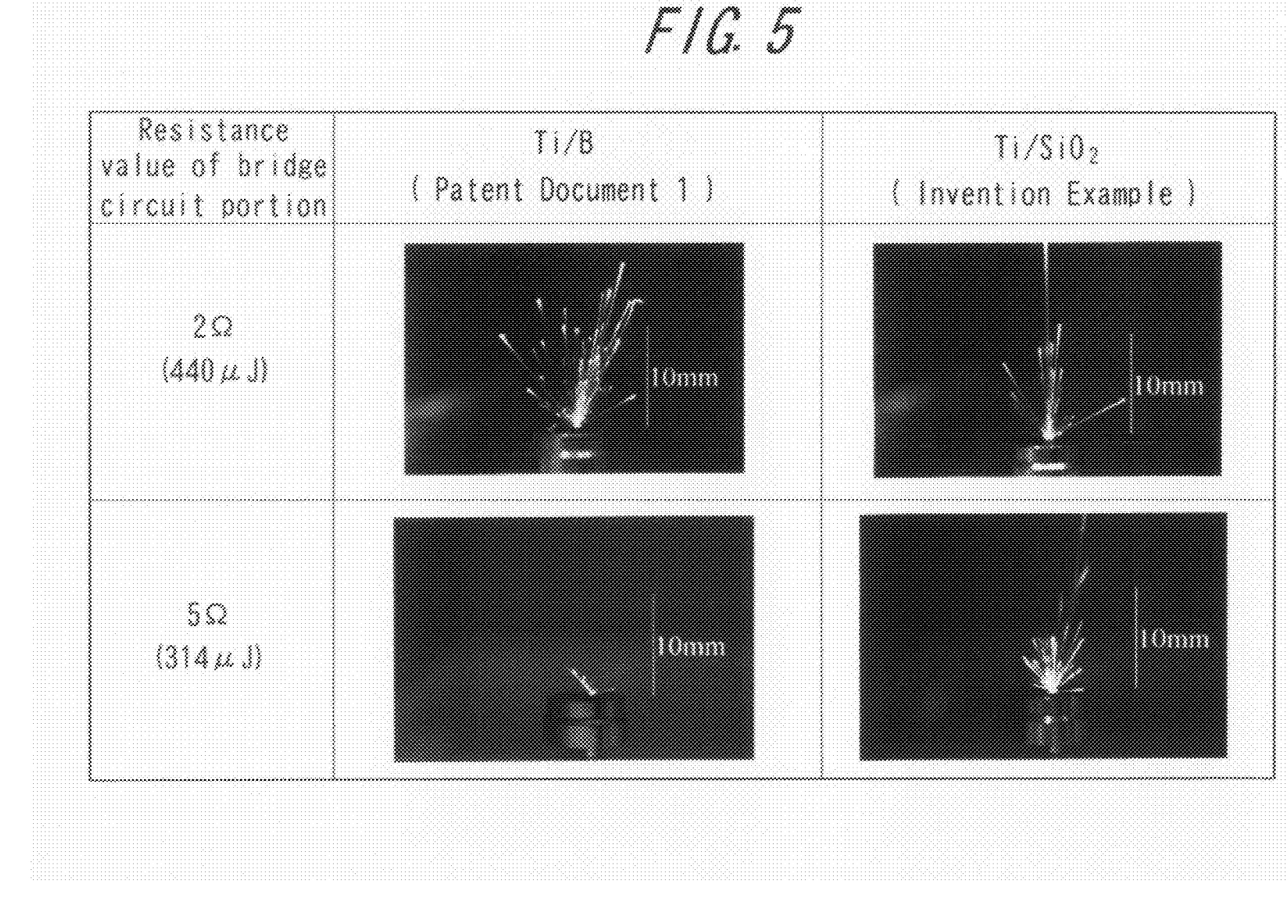
FIG. 5 is a photograph showing a comparison of a spark emitting state when using a semiconductor bridge device of Patent Document 1 and a semiconductor bridge device according to the invention.

In FIG. 5 is shown the comparison of the spark emitting state between the semiconductor bridge device of Patent Document 1 and the semiconductor bridge device according to the invention, from which it is clear that the spark height is higher in the semiconductor bridge device according to the invention, even when the resistance value of the bridge portion is either 2Ω or 5Ω.

INDUSTRIAL APPLICABILITY

According to the semiconductor bridge device of the invention, there can be emitted an amount of sparks sufficient to ignite the primary charge at a small energy in a short time of about several microseconds.

Also, in the semiconductor bridge device of the invention, such a semiconductor bridge device can be protected from the occurrence of static discharge by forming the zener diode on the substrate.

Further, according to the igniter of the invention, sparks enough to ignite the primary charge can be emitted even if the resistance value of the bridge portion is made high and the current is made small.

The invention claimed is:

1. A semiconductor bridge device comprising a substrate, a pair of land portions, a bridge portion electrically connecting between the pair of the land portions, and an electrode pad arranged on each upper surface in the pair of the land portions and emitting sparks at the bridge portion through an electric current passed between the electrode pads, in which the pair of the land portions and the bridge portion consist of a laminate formed by alternately laminating a metal layer and a metal oxide layer plural times, and an outermost layer in the laminate is a metal layer, and a metal oxide having a decomposition temperature of higher than 1500° C. is used in the metal oxide layer.

2. A semiconductor bridge device according to claim 1, wherein the metal oxide having a decomposition temperature of higher than 1500° C. is $SiO_2$ or $TiO_2$, and a metal constituting the metal layer is Ti or Zr.

3. A semiconductor bridge device according to claim 2, wherein the metal oxide having a decomposition temperature of higher than 1500° C. is $SiO_2$, and the metal constituting the metal layer is Ti.

4. A semiconductor bridge device according to claim 1, wherein each of the metal layer and the metal oxide layer in the laminate has a thickness of 0.02-3 microns.

5. A semiconductor bridge device according to claim 1, wherein the laminate has an overall thickness of 0.1-10 microns.

6. A semiconductor bridge device according to claim 1, wherein the metal layer as the outermost layer in the laminate has a thickness of 0.5-3 microns.

7. A semiconductor bridge device according to claim 1, wherein the metal oxide layer is existent at a lowest position of the laminate and has a thickness of 0.5-3 microns.

8. A semiconductor bridge device according to claim 1, wherein the bridge portion has a value of resistance of 0.5-10Ω.

9. A semiconductor bridge device according to claim 1, wherein the bridge portion is provided on its upper face with a protection film.

10. An igniter comprising a cup body, a plug holding a plurality of electrode pins at an insulated state and sealing an opening portion of the cup body, a primary charge filled in an inside of the cup body, and a heating element connected to the electrode pins to ignite through the application of an electric current from an exterior and disposed in contact with the primary charge, in which a semiconductor bridge device as claimed in any one of claims 1 to 9 is used as the heating element.

* * * * *